(12) United States Patent
Chang

(10) Patent No.: US 9,654,310 B1
(45) Date of Patent: May 16, 2017

(54) ANALOG DELAY CELL AND TAPPED DELAY LINE COMPRISING THE ANALOG DELAY CELL

(71) Applicant: NXP USA, Inc., Austin, TX (US)

(72) Inventor: Yi Cheng Chang, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/356,560

(22) Filed: Nov. 19, 2016

(51) Int. Cl.
| | | |
|---|---|---|
| H03H 7/30 | (2006.01) |
| H03H 7/40 | (2006.01) |
| H03K 5/159 | (2006.01) |
| H04L 25/03 | (2006.01) |

(52) U.S. Cl.
CPC ..... *H04L 25/03025* (2013.01); *H04L 2025/0349* (2013.01)

(58) Field of Classification Search
CPC ......... H04L 25/03012; H04L 25/03019; H04L 25/03025; H04L 2025/03445; H04L 27/01; H04L 25/03267
USPC ................................. 375/229–236, 316–352
See application file for complete search history.

(56) References Cited

U.S. PATENT DOCUMENTS

| | | | | | |
|---|---|---|---|---|---|
| 5,349,245 | A | * | 9/1994 | Hughes ................ | G11C 27/028 327/317 |
| 5,471,665 | A | * | 11/1995 | Pace ...................... | H03D 3/008 330/259 |
| 5,592,340 | A | * | 1/1997 | Minuhin .......... | G11B 20/10009 360/46 |
| 5,682,125 | A | * | 10/1997 | Minuhin .......... | G11B 20/10009 333/166 |
| 5,736,909 | A | * | 4/1998 | Hauser ................... | H03H 15/00 333/139 |
| 5,789,989 | A | * | 8/1998 | Paschal ................. | H03K 3/354 331/177 R |
| 5,822,236 | A | * | 10/1998 | Dosho .................... | G11C 27/00 348/E9.036 |
| 5,872,488 | A | * | 2/1999 | Lai ....................... | H03K 3/0231 331/175 |

(Continued)

OTHER PUBLICATIONS

Ferreira, L. et al, "A 60-dB Gain OTA Operating at 0.25-V Power Supply in 130-nm Digital CMOS Process", IEEE Transactions on Circuits and Systems-I: Regular Papers, vol. 61, No. 6, Jun. 2014, pp. 1609-1617.

(Continued)

*Primary Examiner* — James M Perez

(57) ABSTRACT

An analog delay cell is provided that includes a transconductance-capacitance stage and an inductive transimpedance amplifier stage that provides an all-pass transfer function. In another embodiment, an adaptive analog delay cell including a transconductance (gm) plus capacitance (C) stage and an inductive-capacitance transimpedance amplifier (TIA) stage with digitally programmable phase-shift is provided. The adaptive analog delay cell increases the phase-shift by incorporating an LC network in the feedback path of the transimpedance stage. The disclosed analog delay cells can be used to provide delays in a tapped delay line. Also, the disclosed analog delay cells may be used to perform the multiplier and summation functions of a tapped delay line in addition to providing the delays. In another embodiment, the transimpedance amplifier stage includes an inductive-capacitive transimpedance amplifier stage.

20 Claims, 6 Drawing Sheets

(56) References Cited

U.S. PATENT DOCUMENTS

| | | | | |
|---|---|---|---|---|
| 6,281,715 B1* | 8/2001 | DeClue | H03K 19/018528 | 327/108 |
| 6,348,830 B1* | 2/2002 | Rebeiz | H03D 7/1425 | 327/355 |
| 6,509,855 B1* | 1/2003 | Cable | H03M 1/002 | 323/316 |
| 6,650,182 B2* | 11/2003 | Kim | H03F 3/3008 | 330/252 |
| 6,897,685 B2* | 5/2005 | Sato | H04L 25/0278 | 326/82 |
| 6,956,407 B2* | 10/2005 | Baig | H04L 25/0288 | 327/141 |
| 7,269,212 B1* | 9/2007 | Chau | H04L 25/03878 | 326/80 |
| 7,302,461 B2* | 11/2007 | Mukherjee | H03F 3/45183 | 327/276 |
| 7,319,851 B2* | 1/2008 | Klumperink | H03D 7/1441 | 327/113 |
| 7,519,348 B2* | 4/2009 | Shah | H03D 7/14 | 455/285 |
| 7,598,788 B2* | 10/2009 | Cao | H03K 3/356034 | 327/266 |
| 7,710,159 B2* | 5/2010 | Shinde | H03K 19/01707 | 326/115 |
| 7,720,188 B2* | 5/2010 | Sanduleanu | H03L 7/087 | 327/157 |
| 7,760,012 B1* | 7/2010 | Opris | H03F 3/45179 | 327/337 |
| 7,957,500 B2* | 6/2011 | Sanduleanu | H03L 7/087 | 327/157 |
| 8,203,375 B2* | 6/2012 | de Jong | H03D 7/1441 | 327/357 |
| 8,379,702 B2* | 2/2013 | Lutz | H03D 7/1441 | 375/222 |
| 8,437,388 B2* | 5/2013 | Zeng | H04L 25/0274 | 326/46 |
| 8,520,785 B2* | 8/2013 | He | H04B 1/18 | 375/295 |
| 8,606,210 B2* | 12/2013 | Ru | H03D 7/14 | 455/280 |
| 8,649,749 B2* | 2/2014 | He | H04B 1/28 | 330/252 |
| 8,675,751 B2* | 3/2014 | Cannon | H04L 27/183 | 375/144 |
| 8,680,937 B2* | 3/2014 | Chang | H03H 7/40 | 333/18 |
| 8,816,782 B2* | 8/2014 | Chang | H03B 5/02 | 331/108 R |
| 9,106,314 B2* | 8/2015 | de Graauw | H04B 1/40 | |
| 9,191,127 B2* | 11/2015 | Koli | H03H 19/008 | |
| 9,209,746 B2* | 12/2015 | Phan Le | H03B 5/30 | |
| 9,276,535 B2* | 3/2016 | van Sinderen | H03F 3/193 | |
| 9,325,553 B2* | 4/2016 | Kaukovuori | H04B 1/0057 | |
| 9,329,259 B2* | 5/2016 | de Graauw | G01S 7/03 | |
| 9,379,785 B2* | 6/2016 | Shameli | H04B 5/02 | |
| 9,496,889 B2* | 11/2016 | Pavlovic | H03M 3/464 | |
| 9,509,290 B2* | 11/2016 | van Sinderen | H03K 3/0315 | |
| 9,553,742 B1* | 1/2017 | Xu | H04L 25/03828 | |
| 2004/0056698 A1* | 3/2004 | Elliott | H03K 5/131 | 327/250 |
| 2004/0070561 A1* | 4/2004 | Chi | G09G 3/3648 | 345/92 |
| 2005/0114426 A1* | 5/2005 | Lin | H04L 27/01 | 708/800 |
| 2006/0126702 A1* | 6/2006 | Burdett | H04B 1/30 | 375/136 |
| 2006/0135109 A1* | 6/2006 | Klumperink | H03D 7/1441 | 455/323 |
| 2006/0208791 A1* | 9/2006 | Vilhonen | H03H 19/008 | 327/551 |
| 2006/0293017 A1* | 12/2006 | Kim | H03D 7/1433 | 455/323 |
| 2008/0284487 A1* | 11/2008 | Pullela | H03D 7/1441 | 327/355 |
| 2009/0191833 A1* | 7/2009 | Kaczman | H03F 1/301 | 455/296 |
| 2009/0273370 A1* | 11/2009 | Shinde | H03K 19/01707 | 326/115 |
| 2010/0029323 A1* | 2/2010 | Tasic | H03G 3/3052 | 455/550.1 |
| 2010/0151900 A1* | 6/2010 | Koli | G11C 27/024 | 455/550.1 |
| 2010/0205488 A1* | 8/2010 | Sanduleanu | H03L 7/087 | 714/700 |
| 2011/0095807 A1* | 4/2011 | de Jong | H03D 7/1441 | 327/361 |
| 2011/0214103 A1* | 9/2011 | Onete | G06N 3/126 | 716/137 |
| 2011/0222633 A1* | 9/2011 | Pullela | H03D 7/165 | 375/318 |
| 2011/0228823 A1* | 9/2011 | Lutz | H04B 3/141 | 375/219 |
| 2011/0228824 A1* | 9/2011 | Lutz | H04B 3/141 | 375/219 |
| 2011/0228871 A1* | 9/2011 | Lutz | H04L 25/0286 | 375/295 |
| 2011/0298521 A1* | 12/2011 | Ru | H03D 7/14 | 327/356 |
| 2012/0033769 A1* | 2/2012 | He | H04B 1/18 | 375/350 |
| 2012/0045223 A1* | 2/2012 | Oku | H04B 10/504 | 398/201 |
| 2012/0063555 A1* | 3/2012 | Pullela | H04B 1/1638 | 375/350 |
| 2012/0121004 A1* | 5/2012 | Chang | H03H 7/40 | 375/232 |
| 2012/0171980 A1* | 7/2012 | Sivonen | H03H 19/008 | 455/293 |
| 2012/0194224 A1* | 8/2012 | Moon | H03K 5/1515 | 327/99 |
| 2012/0200334 A1* | 8/2012 | Connell | H03D 7/1441 | 327/359 |
| 2012/0235727 A1* | 9/2012 | Oku | H01S 5/0428 | 327/306 |
| 2012/0286887 A1* | 11/2012 | Chang | H03B 5/02 | 331/108 R |
| 2013/0015901 A1* | 1/2013 | Kitsunezuka | H03D 7/1441 | 327/356 |
| 2013/0109337 A1* | 5/2013 | He | H04B 1/28 | 455/256 |
| 2013/0114665 A1* | 5/2013 | Aziz | H04L 25/03057 | 375/233 |
| 2013/0154728 A1* | 6/2013 | Basaran | H03F 1/086 | 329/348 |
| 2013/0195165 A1* | 8/2013 | Poulton | H04B 1/04 | 375/229 |
| 2013/0208782 A1* | 8/2013 | Agrawal | H04L 27/01 | 375/233 |
| 2013/0235959 A1* | 9/2013 | Nentwig | H04B 1/10 | 375/349 |
| 2013/0335163 A1* | 12/2013 | Aggarwal | H03H 19/002 | 333/132 |
| 2014/0155001 A1* | 6/2014 | de Graauw | H04B 1/40 | 455/73 |
| 2014/0159826 A1* | 6/2014 | Phan Le | H03B 5/30 | 331/154 |
| 2014/0159935 A1* | 6/2014 | de Graauw | G01S 7/03 | 342/21 |
| 2014/0340151 A1* | 11/2014 | van Sinderen | H03F 3/193 | 330/260 |
| 2015/0022253 A1* | 1/2015 | Tsunoda | H03K 5/133 | 327/231 |
| 2015/0288392 A1* | 10/2015 | Floyd | H04W 16/14 | 375/130 |
| 2015/0319020 A1* | 11/2015 | Song | H04L 25/03 | 345/204 |

(56) References Cited

U.S. PATENT DOCUMENTS

2016/0105196 A1* 4/2016 Pavlovic .............. H03M 3/464
　　　　　　　　　　　　　　　　　　　　　375/340

OTHER PUBLICATIONS

Mammei, E. et al., "Power-Scalable 7-Tap FIR Equalizer with Tunable Active Delay Line for 10-to-25Gb/s Multi-Mode Fiber EDC in 28nm LP-CMOS", 2014 IEEE International Solid-State Circuits Conference, 19 pages.
Wu, H. et al., "Integrated Transversal Equalizers in High-Speed Fiber-Optic Systems", IEEE Journal of Solid-State Circuits, vol. 38, No. 12, Dec. 2003, pp. 2131-2137.

* cited by examiner

ANALOG DELAY CELL AND TAPPED DELAY LINE COMPRISING THE ANALOG DELAY CELL

BACKGROUND

Field

This disclosure relates generally to electronic circuits and more specifically to an analog delay cell and tapped delay line using the analog delay cell.

Related Art

FIG. 1 illustrates a conventional feed-forward equalizer 10 having a pre-filter 12, tapped delay line 14, and decision feedback equalizer (DFE) and finite impulse response (FIR) block 20. In one embodiment, pre-filter 12 is a continuous-time linear equalizer (CTLE). Tapped delay line 14 includes a plurality of delay cells, or elements, 16, a plurality of multipliers 18, and a summation circuit 38. The plurality of delay cells 16 includes a plurality of representative delay cells 22, 24, and 26 connected together in series. The plurality of multipliers 18 includes multipliers 28, 30, 32, 34, and 36. An input of each of the multipliers 18 is connected to an output of each of the delay elements 16, and an output of each of the multipliers is connected to an input of the summation circuit 38.

The plurality of delay cells 16 may be implemented in a number of ways. One way to implement delay in a tapped delay line uses transmission lines, or artificial transmission lines (with a lump LC network). However, the transmission lines may require long lines and large dimension components to implement. Also, the resulting bandwidth may be too narrow and need many segments for high speed SerDes (serializer/deserializer) applications. Conventional active analog delay cells with active inductors may require further inductance compensation circuits, and it may be difficult to maintain the consistency of the delay lines. In addition, an active inductor may have its own bandwidth limitations. Prior digital-based delay cells, for example, D-type flip-flops, or latches, may not be able to support the required high speed capacity at data rates greater than about 10 gigabits per second (Gb/s). Also, digital-based delay cells may not be able to support small input data amplitudes due to intersymbol interference (ISI).

Therefore, what is needed is an analog delay cell that solves at least some of the above problems.

BRIEF DESCRIPTION OF THE DRAWINGS

The present invention is illustrated by way of example and is not limited by the accompanying figures, in which like references indicate the same or similar elements between the various embodiments. Elements in the figures are illustrated for simplicity and clarity and have not necessarily been drawn to scale.

DETAILED DESCRIPTION

Figure 1:
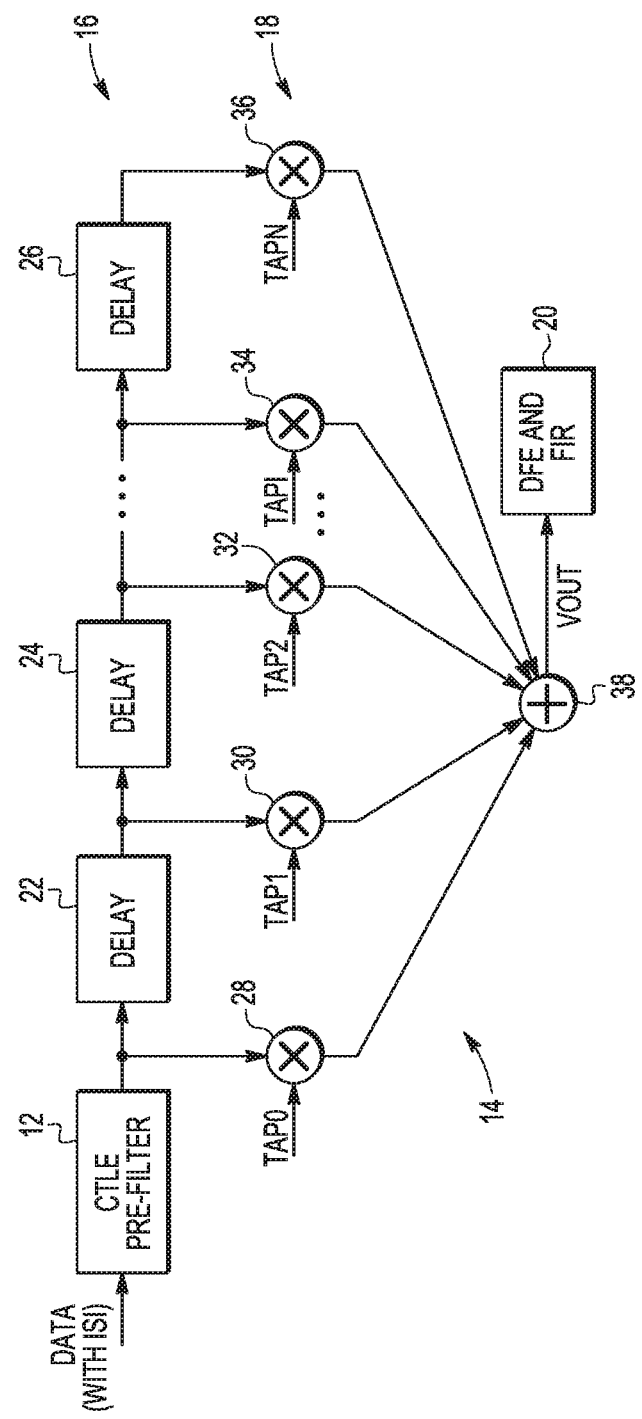
FIG. 1 illustrates a feed-forward equalizer in accordance with the prior art.

Generally, there is provided, an analog delay cell with a transconductance-capacitance stage and an inductive transimpedance amplifier stage that provides an all-pass transfer function. In another embodiment, an adaptive analog delay cell including a transconductance (gm) plus capacitance (C) stage and an inductive-capacitance transimpedance amplifier (TIA) stage with digitally programmable phase-shift is provided. The adaptive analog delay cell increases the phase-shift by incorporating an LC network in the feedback path of the transimpedance stage. The disclosed analog delay cells can be used to provide delays in a tapped delay line. Also, the disclosed analog delay cells may be used to perform the multiplier and summation functions of a tapped delay line in addition to providing the delays.

In one embodiment, there is provided, an analog delay cell comprising: a transconductance stage comprising: a first current source having a first terminal coupled to receive a first power supply voltage, and a second terminal; a first transistor having a first current electrode coupled to the second terminal of the first current source, a control electrode for receiving a first input signal, and a second current electrode; a second current source having a first terminal coupled to receive the first power supply voltage, and a second terminal; a second transistor having a first current electrode coupled to the second terminal of the second current source, a control electrode for receiving a second input signal, and a second current electrode coupled to the second current electrode of the first transistor; a variable capacitor having a first terminal coupled to the first current electrode of the first transistor, a second terminal coupled to the first current electrode of the second transistor, and a control terminal for receiving a control signal; and a first current sink having a first terminal coupled to the second current electrodes of the first and second transistors, and a second terminal coupled to receive a second power supply voltage, wherein the first current sink provides negative-source degeneration; and a transimpedance stage comprising: a first inverter having an input terminal coupled to the first current electrode of the first transistor, an output terminal for providing a first output signal, a first power supply terminal and a second power supply terminal; a second inverter having an input terminal coupled to the first current electrode of the second transistor, and an output terminal for providing a second output signal, a first power supply terminal and a second power supply terminal; a first inductor having a first terminal coupled to the input terminal of the first inverter, and a second terminal coupled to the output terminal of the first inverter; a second inductor having first terminal coupled to the input terminal of the second inverter, and a second terminal coupled to the output terminal of the second inverter; and a second current sink having a first terminal coupled to the second power supply terminals of the first and second inverters, and second terminal coupled to receive the second power supply voltage. The analog delay cell may be one of a plurality of analog delay cells coupled together in series to form a finite impulse response tapped delay line. The analog delay cell may provide an all-pass delay function. The analog delay cell may further comprise: a first variable resistor and a first capacitor coupled together in series with each other and coupled in parallel with the first inductor; a first resistor coupled in parallel with the first inductor; a second variable resistor and a second capacitor coupled together in series with each other and in parallel with the second inductor; and a second resistor coupled in parallel with the second inductor. The first current sink may further comprise a negative-source degeneration unit, wherein the negative-source degeneration unit may be configurable to provide at least one of: a diode connection between the second current electrodes of the first and second transistors and the second power supply in response to a first control signal; a cross-coupled pair of transistors coupled between the second current electrodes of the first and second transistors and the second power supply in response to a second control signal; and a current mirror connection coupled between the second current electrodes of the first and second transistors and the second power supply in response to a third control signal. The analog delay cell may be used in a tapped delay line comprising a plurality of delay cells coupled together in series, a plurality of multipliers, each multiplier of the plurality of multipliers coupled to an output of a corresponding delay cell of the plurality of delay cells, an output of each of the multipliers coupled to an input of a summation circuit, wherein each multiplier comprises a transconductance stage substantially the same as the transconductance stage of the analog delay cell, and wherein the summation circuit comprises a transimpedance stage substantially the same as the transimpedance stage of the analog delay cell. The analog delay cell may further comprise a resistor having a first terminal coupled to the second current electrode of the first transistor of the transconductance stage, and a second terminal coupled to the second current electrode of the second transistor of the transconductance stage. The first and second input signals may be characterized as being a differential input signal and the first and second output signals may be characterized as being a differential output signal. The analog delay cell may be used in a feed-forward equalization circuit comprising: a pre-filter coupled to receive an input signal, and an output; a plurality of analog delay cells coupled together in series to receive the input signal, and having a plurality of taps; a plurality of analog multiplier circuits, each of the plurality of analog multiplier circuits having an input coupled to a corresponding tap of the plurality of taps, and an output; and an analog summation circuit coupled to the outputs of the plurality of analog multiplier circuits, and an output for providing an output signal.

In another embodiment, there is provided, a circuit comprising: a plurality of transconductance stages arranged to provide an analog delay and an analog multiplier function, each of the transconductance stages comprising: a first current source having a first terminal coupled to receive a first power supply voltage, and a second terminal; a first transistor having a first current electrode coupled to the second terminal of the first current source, a control electrode for receiving a first input signal, and a second current electrode; a second current source having a first terminal coupled to receive the first power supply voltage, and a second terminal; a second transistor having a first current electrode coupled to the second terminal of the second current source, a control electrode for receiving a second input signal, and a second current electrode coupled to the second current electrode of the first transistor; a variable capacitor having a first terminal coupled to the first current electrode of the first transistor, a second terminal coupled to the first current electrode of the second transistor, and a control terminal for receiving a control signal; and a negative-source degeneration unit having a first terminal coupled to the second current electrode of the first transistor, a second terminal coupled to the second current electrode of the second transistor, a control terminal for receiving a control signal for setting a delay, and a second terminal coupled to receive a second power supply voltage; and a transimpedance stage coupled to the plurality of transconductance stages, the transimpedance stage comprising: a first inverter having an input terminal coupled to the first current electrode of the first transistor, an output terminal for providing a first output signal, a first power supply terminal and a second power supply terminal; a second inverter having an input terminal coupled to the first current electrode of the second transistor, and an output terminal for providing a second output signal, a first power supply terminal and a second power supply terminal; a first inductor having a first terminal coupled to the input terminal of the first inverter, and a second terminal coupled to the output terminal of the first inverter; a second inductor having first terminal coupled to the input terminal of the second inverter, and a second terminal coupled to the output terminal of the second inverter; and a current sink having a first terminal coupled to the second power supply terminals of the first and second inverters, and second terminal coupled to receive the second power supply voltage. The circuit may further comprise: a first variable resistor and a first capacitor coupled together in series with each other and coupled in parallel with the first inductor; a first resistor coupled in parallel with the first inductor; a second variable resistor and a second capacitor coupled together in series with each other and in parallel with the second inductor; and a second resistor coupled in parallel with the second inductor. The analog delay cell may provide an all-pass delay function. The negative-source degeneration unit may be configurable to provide at least one of: a diode connection between the second current electrodes of the first and second transistors and the second power supply in response to a first control signal; a cross-coupled pair of transistors coupled between the second current electrodes of the first and second transistors and the second power supply; and a current mirror connection coupled between the second current electrodes of the first and second transistors and the second power supply. The circuit may further comprise a resistor having a first terminal coupled to the second current electrode of the first transistor of the transconductance stage, and a second terminal coupled to the second current electrode of the second transistor of the transconductance stage. The first and second input signals may be characterized as being a differential input signal and the first and second output signals may be characterized as being a differential output signal. The circuit may further comprise a pre-filter having an input coupled to receive an input signal, and an output coupled to the plurality of transconductance stages.

In yet another embodiment, there is provided, a circuit comprising: a pre-filter having an input coupled to receive an input signal, and an output; a plurality of transconductance stages arranged to provide an analog delay and an analog multiplier function for the input signal, each of the transconductance stages comprising: a first current source having a first terminal coupled to receive a first power supply voltage, and a second terminal; a first transistor having a first current electrode coupled to the second terminal of the first current source, a control electrode for receiving a first input signal, and a second current electrode; a second current source having a first terminal coupled to receive the first power supply voltage, and a second terminal; a second transistor having a first current electrode coupled to the second terminal of the second current source, a control electrode for receiving a second input signal, and a second current electrode coupled to the second current electrode of the first transistor; a variable capacitor having a first terminal coupled to the first current electrode of the first transistor, a second terminal coupled to the first current electrode of the second transistor, and a control terminal for receiving a control signal; and a negative-source degeneration unit having a first terminal coupled to the second current electrode of the first transistor, a second terminal coupled to the second current electrode of the second transistor, a control terminal for receiving a control signal, and a second terminal coupled to receive a second power supply voltage, wherein the negative-source degeneration unit is configurable to provide at least one of: a diode connection between the second current electrodes of the first and second transistors and the second power supply in response to a first control signal; a cross-coupled pair of transistors coupled between the second current electrodes of the first and second transistors and the second power supply; and a current mirror connection coupled between the second current electrodes of the first and second transistors and the second power supply; and a transimpedance stage coupled to the plurality of transconductance stages, the transimpedance stage comprising: a first inverter having an input terminal coupled to the first current electrode of the first transistor, an output terminal for providing a first output signal, a first power supply terminal and a second power supply terminal; a second inverter having an input terminal coupled to the first current electrode of the second transistor, and an output terminal for providing a second output signal, a first power supply terminal and a second power supply terminal; a first inductor having a first terminal coupled to the input terminal of the first inverter, and a second terminal coupled to the output terminal of the first inverter; a second inductor having first terminal coupled to the input terminal of the second inverter, and a second terminal coupled to the output terminal of the second inverter; and a current sink having a first terminal coupled to the second power supply terminals of the first and second inverters, and second terminal coupled to receive the second power supply voltage. The circuit may further comprise a resistor having a first terminal coupled to the second current electrode of the first transistor of the transconductance stage, and a second terminal coupled to the second current electrode of the second transistor of the transconductance stage. The first and second input signals may be characterized as being a differential input signal and the first and second output signals may be characterized as being a differential output signal. The circuit may further comprise: a first variable resistor and a first capacitor coupled together in series with each other and coupled in parallel with the first inductor; a first resistor coupled in parallel with the first inductor; a second variable resistor and a second capacitor coupled together in series with each other and in parallel with the second inductor; and a second resistor coupled in parallel with the second inductor.

Figure 2:
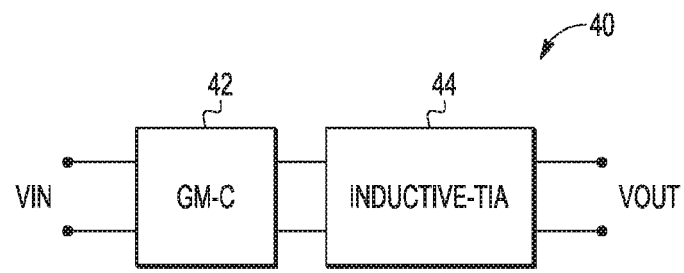
FIG. 2 illustrates an analog delay cell in accordance with an embodiment.

FIG. 2 illustrates an analog delay cell 40 in accordance with an embodiment. Analog delay cell 40 includes transconductance-capacitance amplifier stage (gm-C) 42 and inductive-transimpedance amplifier (TIA) stage 44. Transconductance stage 42 has a first input for receiving a first input signal and a second input for receiving a second input signal. The first and second input signals may together provide a differential input signal VIN. An output of transconductance stage 42 is connected to an input of transimpedance stage 44. A first output of transimpedance stage 44 provides a first output signal and a second output of transimpedance stage 44 provides a second output signal. The first and second output signals together provide a differential output signal VOUT.

Analog delay cell 40 provides an all-pass transfer function and can be substituted for each of delay cells 22, 24, and 26 of conventional feed-forward equalizer 10 in FIG. 1. To provide sufficient delay time, several identical delay cells 40 can be connected together in series for one of delay cells 22, 24, and 26. Analog delay cell 40 may be implemented in an integrated circuit manufactured using complementary metal-oxide semiconductor (CMOS) processing technology. In another embodiment, a different processing technology may be used.

Figure 3:
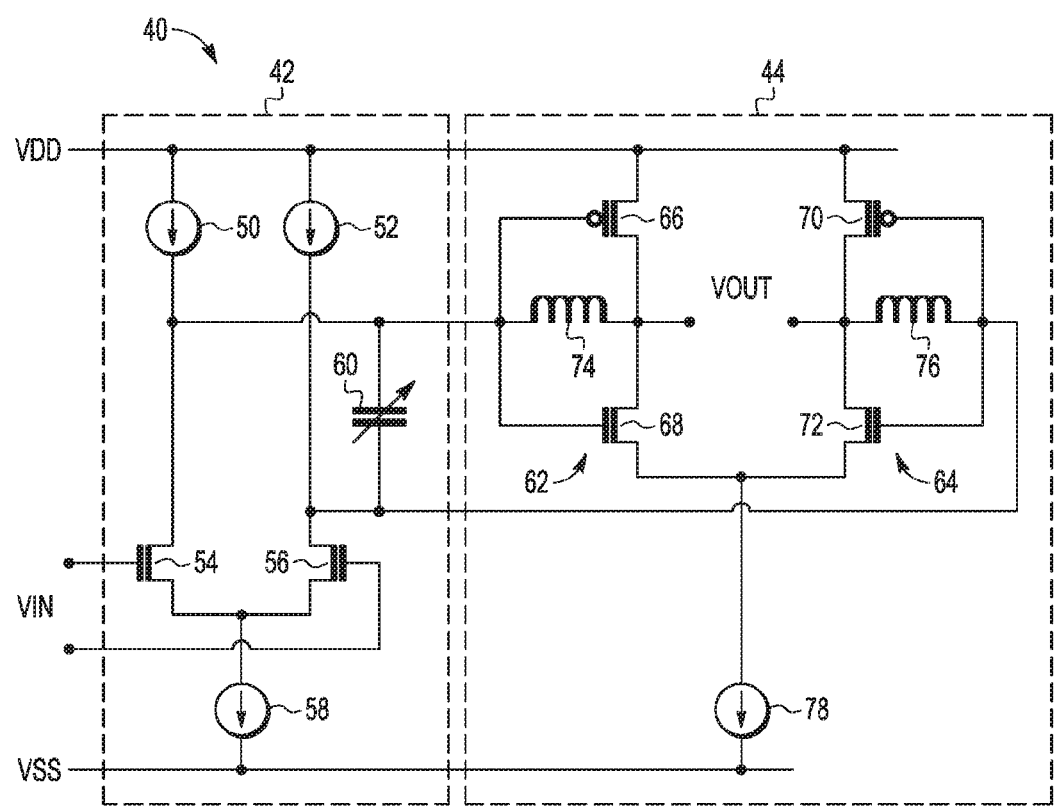
FIG. 3 illustrates the analog delay cell of FIG. 2 in more detail.

FIG. 3 illustrates analog delay cell 40 (FIG. 2) in more detail. In FIG. 3, gm-C stage 42 includes current sources 50 and 52, N-channel transistors 54 and 56, current sink 58, and variable capacitor 60. Inductive-TIA stage 44 includes inverters 62 and 64, inductors 74 and 78, and current sink 78. Inverter 62 includes P-channel transistor 66 and N-channel transistor 68. Inverter 64 includes P-channel transistor 70 and N-channel transistor 72. The circuits illustrated in FIG. 3 are characterized as being analog circuits, as opposed to being digital circuits. For example, inverters 62 and 64 may operate with DC currents and are therefore may not switch between logic states as is common in more conventional digital inverters that have the same or similar circuit topography.

In gm-C stage 42, current source 50 has a first terminal connected to receive a power supply voltage labeled VDD, and a second terminal. Current source 52 has a first terminal connected to receive power supply voltage VDD, and a second terminal. N-channel transistor has a first current element (drain) connected to the second terminal of current source 50, a control electrode (gate) connected to receive a first input signal, and a second current electrode (source). N-channel transistor 56 has a first current electrode connected to the second terminal of current source 52, a control electrode for receiving a second input signal, and a second current electrode connected to the second current electrode of N-channel transistor 54. The first and second input signals together provide different input signal VIN to be delayed. Current sink 58 has a first terminal connected to the second current electrodes of N-channel transistors 54 and 56, and a second terminal connected to receive a power supply voltage labeled VSS. In one embodiment, VDD is a positive power supply voltage and VSS is connected to ground. In other embodiments, the power supply voltages may be different. Variable capacitor 60 has a first terminal connected to the first current electrode of N-channel transistor 54, a second terminal connected to the first current electrode of N-channel transistor 56, and a control terminal for receiving a control signal (not shown) for selecting a capacitance value for variable capacitor 60.

In inductive-TIA stage 44, P-channel transistor 66 has a first current electrode (source) connected to receive power supply voltage VDD, a control electrode (gate) connected to the first current electrode of N-channel transistor 54, and a second current electrode (drain) for providing a first output signal. N-channel transistor 68 has a first current electrode connected to the second current electrode of P-channel transistor 66 to form an output terminal for inverter 62, a control electrode connected to the control electrode of P-channel transistor 66 to form an input terminal of inverter 62, and a second current electrode. P-channel transistor 70 has a first current electrode connected to receive VDD, a control electrode connected to the first current electrode N-channel transistor 56, and a second current electrode for providing a second output signal. The first and second output signals are a differential output signal labeled VOUT. N-channel transistor 72 has a first current electrode connected to the second current electrode of P-channel transistor 70 to form an output terminal for inverter 64, a control electrode connected to the control electrode of P-channel transistor 70 to form an input terminal of inverter 64, and a second current electrode connected to the second current electrode of N-channel transistor 68. Inductor 74 has a first terminal connected to the output terminal of inverter 62, and a second terminal connected to the input terminal of inverter 62. Inductor 76 has a first terminal connected to the output terminal of inverter 64, and a second terminal connected to the input terminal of inverter 64. Inductors 74 and 76 provide feedback for inverters 62 and 64, respectively.

Transconductance stage 42 provides a voltage-to-current conversion. Transimpedance stage 44 provides a current-to-voltage conversion. Analog delay cell 40 provides all-pass filtering. That is, analog delay cell 40 passes all frequencies equally in gain but changes the phase relationship of the various frequencies. Current sources 50 and 52 and current sink 58 may include passive and/or active devices. N-channel transistors 54 and 56 are connected together as a differential pair. The delay time may be controlled by adjusting a capacitance value of variable capacitor 60. The feedback inductors 74 and 76 provide a load component for gm-C stage 42. A first order all-pass transfer function is given by $$\frac{V_{Out}}{V_{in}} = -\frac{g_{mi}}{g_{mt}} \frac{(1 - s \cdot \tau)}{(1 + s \cdot \tau)}$$

where $L_f$ is the inductance of inductors 74 and 76, $g_{mi}$ is the conductance of the gm-C stage 42, $g_{mt}$ is the conductance of inductive TIA stage 44, $C_g$ is the capacitance of variable capacitor 60, and $$\tau = L_f \cdot g_{mt} = \frac{C_g}{g_{mt}}$$

Note that in some embodiments, the phase-shift (delay-time $\tau$ may not be large enough. Several identical cells in series may be needed to achieve a desired delay time.

The outputs of gm-C stage 42 provide a differential current to an input of inductive TIA stage 44. Inductive TIA stage 44 has a relatively low input impedance compared to a conventional MOS gate impedance because of feedback inductors 74 and 76. The output of inductive TIA stage 44 provides a differential output voltage signal VOUT. Both of stages 42 and 44 provide up to 180-degree phase shift. Gain can be increased by increasing the impedance of feedback inductors 74 and 76. The delay time is determined by the ratios of the peak gain to low frequency gain.

Figure 4:
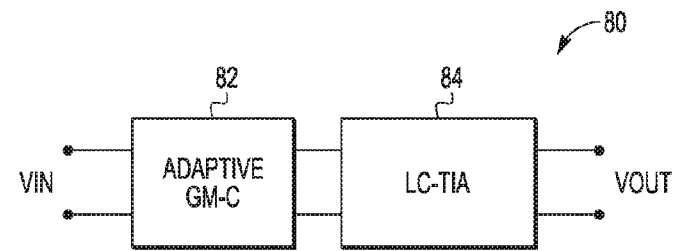
FIG. 4 illustrates an analog delay cell in accordance with another embodiment.

FIG. 4 illustrates analog delay cell 80 in accordance with another embodiment. Analog delay cell 80 includes adaptive gm-C stage 82 and LC-TIA stage 84. Adaptive transconductance-capacitance stage 82 has a first input for receiving a first input signal and a second input for receiving a second input signal. The first and second input signals together provide a differential input signal VIN. An output of adaptive gm-C stage 82 is connected to an input of LC-TIA stage 84. A first output of LC-TIA stage 84 provides a first output signal and a second output of LC-TIA stage 84 provides a second output signal. The first and second output signals together provide a differential output signal VOUT.

Figure 5:
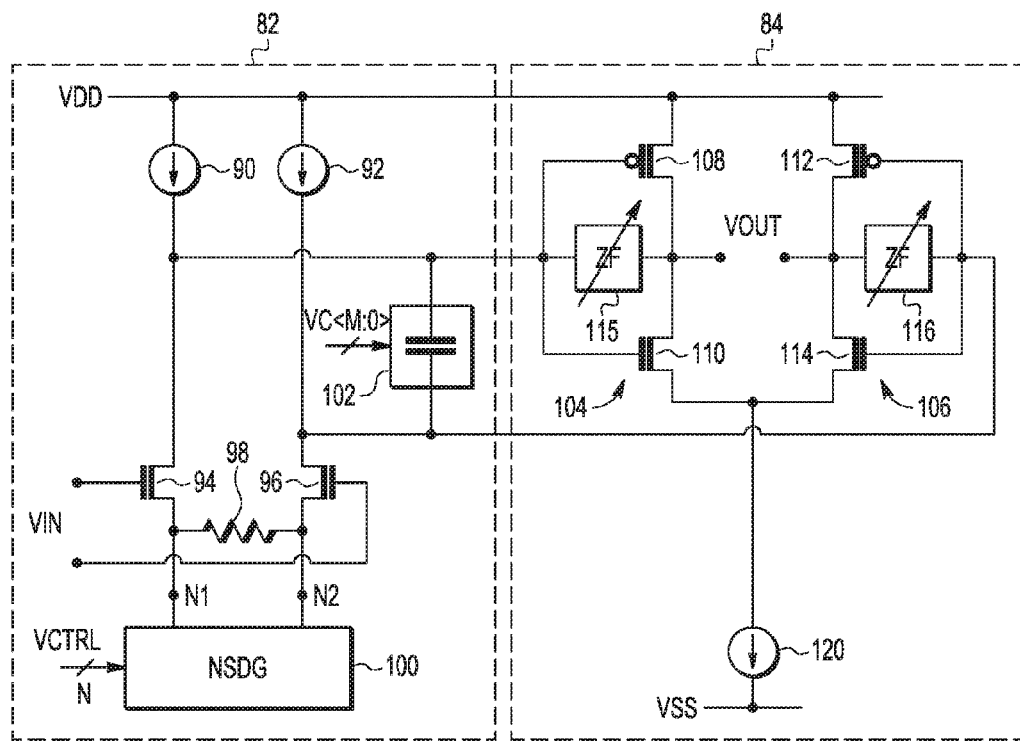
FIG. 5 illustrates the analog delay cell of FIG. 4 in more detail.

Analog delay cell 80 with adaptive gm-C stage 82 is capable of programming a phase-shift up to 180 degrees+/− 25 degrees at 12.5 GHz. The phase-shifting ability is provided by incorporating an LC network (Zf) in the feedback path of the LC-TIA stage 84 as illustrated in FIG. 5. This extends phase shifting around the LC resonant frequency region. In the LC network, a parallel resistor to an LC tank is used to reduce the Q-factor and in turn linearize the phase versus frequency characteristic. The delay time may be programmed using one or both of a source degeneration unit 100 and a variable capacitor 102 (FIG. 5). The analog delay cell 80 may also be used as an analog multiplier and summation circuit for a tapped delay line as discussed below.

FIG. 5 illustrates adaptive analog delay cell 80 of FIG. 4 in more detail. Adaptive analog delay cell 80 includes gm-C stage 82 and LC-TIA stage 84. Transconductance-capacitance stage 82 includes current sources 90 and 92, N-channel transistors 94 and 96, resistor 98, negative source-degeneration (NSDG) unit 100, and variable capacitor 102. Inductive-capacitive transimpedance stage 84 includes inverters 104 and 106, feedback impedance circuits 115 and 116, and current sink 120.

Figure 6:
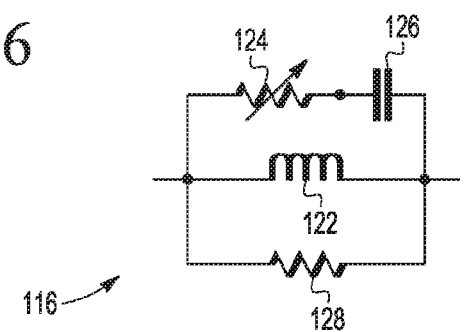
FIG. 6 illustrates one embodiment of a feedback impedance circuit of the transimpedance stage of the analog delay cell of FIG. 5.

A digital control bus (not shown) determines the total number of NSDG units 100 used. NSDG unit 100 is configurable as discussed below in the discussion of FIG. 8. A phase-shifting ability is provided by incorporating variable feedback impedance circuits (Zf) 115 and 116 in the feedback path of the LC-TIA stage 84 as illustrated in FIG. 5. Variable feedback impedance circuits 115 and 116 are illustrated in more detail below in FIG. 6. By adjusting the impedance of variable feedback impedance circuits 115 and 116, phase shifting may be extended around the LC resonant frequency region. In the feedback impedance circuit 116, a parallel resistor to an LC tank is used to reduce the Q-factor and in turn linearize the phase versus frequency characteristic The variable feedback impedance circuit 116 is illustrated in FIG. 6 in more detail. The delay time of analog delay cell 80 may be programmed using a source degeneration unit and a variable capacitor. The analog delay cell 80 may also be used as an analog multiplier and summation circuit as discussed below. The feedback impedance circuits 115 and 116 each has a variable impedance labeled Zf and improves phase linearity and phase shift magnitude. Finite gain peaking compensates data ISI at each delay cell. Phase adjustment is also accomplished using variable capacitor 102 in response to control signals Vc <M:0>, where M is an integer equal to the number of parallel capacitors in variable capacitor 102. The control signals are provided by a control circuit that is not illustrated.

FIG. 6 illustrates one embodiment of variable feedback impedance circuit 116 of the transimpedance stage 84 of the analog delay cell 80 of FIG. 5. In the illustrated embodiment, each of feedback impedance circuits 115 and 116 are identical and include a resistor-inductor-capacitor (RLC) network, where the RLC components are connected together in parallel. In another embodiment of the RLC network, the components may be connected together in series. In another embodiment, feedback impedance circuit 116 can be different and the difference may depend on gain and bandwidth optimizations. For example, for maximum flat response with 0 dB gain, the illustrated parallel RLC network may be adequate. For a maximum bandwidth and gain performance, an in-series connection of the resistor and inductor may be preferred. Feedback impedance circuits 115 and 116 each include variable resistor 124, capacitor 126, inductor 122, and resistor 128. In both of feedback impedance circuits 115 and 116, variable resistor 124 and capacitor 126 are coupled together in series with each other and the combination coupled in parallel with the inductor 122. Variable resistor 124 is responsive to control signals provided by a control circuit that is not shown.

Figure 7:
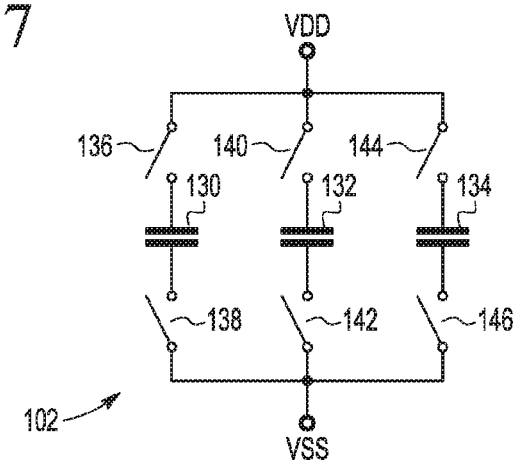
FIG. 7 illustrates the variable capacitor of the transconductance stage of the analog delay cell of FIG. 5.

FIG. 7 illustrates variable capacitor 102 of the gm-C stage 82 of analog delay cell 80 of FIG. 5 in accordance with one embodiment. As discussed above, variable capacitor 102 may be used to adjust the amount of phase shift provided by analog delay cell 80. Variable capacitor 102 is connected between the drains of N-channel transistors 94 and 96. Phase adjustment may be accomplished using variable capacitor 102 using control signals Vc <M:0>, where M is an integer equal to the number of parallel capacitors in variable capacitor 102. A control circuit for providing Vc <M:0> is not illustrated. Variable capacitor 102 includes capacitors 130, 132, and 134, and switches 136, 138, 140, 142, 144, and 146. Two switches are connected in series on either end of each capacitor between power supply voltages VDD and VSS. For example, switches 136 and 138 are connected in series and one each end of capacitor 130. There may be more or fewer than three capacitors. Also, the capacitors may have equal weight or may be binary weighted.

Figure 8:
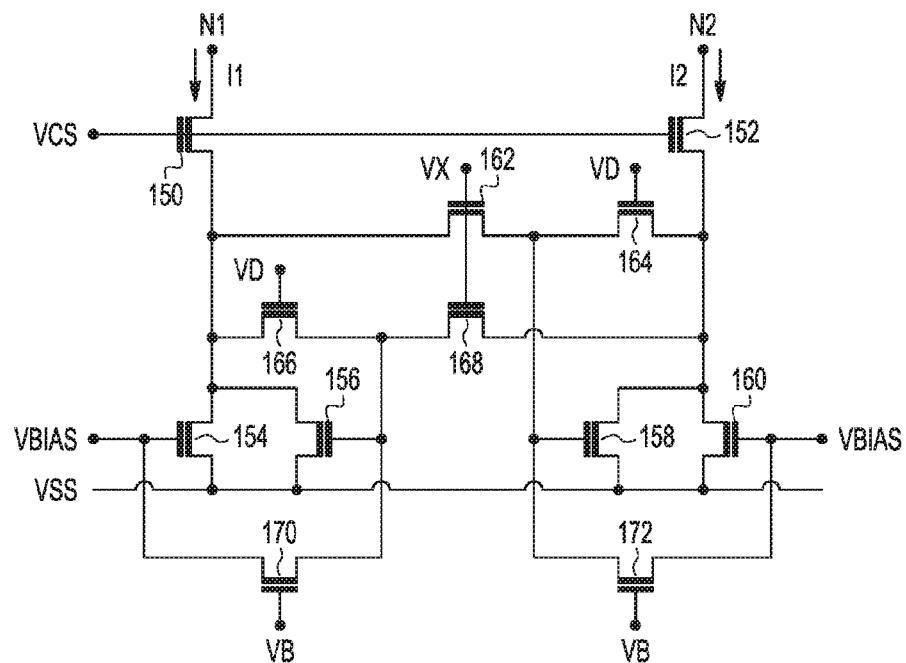
FIG. 8 illustrates an embodiment of the transconductance control circuit of the transconductance stage of the analog delay cell of FIG. 5 in more detail.

FIG. 8 illustrates an embodiment of the NSDG unit 100 of the transconductance stage of the analog delay cell of FIG. 5 in more detail. Negative source-degeneration (NSDG) unit 100 includes N-channel transistors 150, 152, 154, 156, 158, 160, 162, 164, 170, and 172. N-channel transistor 150 has a first current electrode connected to the second current electrode of N-channel transistor 94 (FIG. 5), a control electrode for receiving a control voltage labeled VCS, and a second current electrode. N-channel transistor 152 has a first current electrode connected to the second current electrode of N-channel transistor 96, a control electrode for receiving control voltage VCS, and a second current electrode. N-channel transistor 154 has a first current electrode connected to the second current electrode of N-channel transistor 150, a control electrode for receiving bias voltage VBIAS, and a second current electrode connected to VSS. N-channel transistor 156 has a first current electrode connected to the first current electrode of N-channel transistor 154, a control electrode, and a second current electrode connected to VSS. N-channel transistor 158 has a first current electrode connected to the second current electrode of N-channel transistor 152, a control electrode, and a second current electrode connected to VSS. N-channel transistor 160 has a first current electrode connected to the second current electrode of N-channel transistor 152, a control electrode connected to receive bias voltage VBIAS, and a second current electrode connected to VSS. N-channel transistor 162 has a first current electrode connected to the second current electrode of N-channel transistor 150, a control electrode for receiving control signal VX, and a second current electrode. N-channel transistor 164 has a first current electrode connected to the second current electrode of N-channel transistor 162, a control electrode for receiving control signal VD, and a second current electrode connected to the second current electrode of N-channel transistor 152. N-channel transistor 166 has a first current electrode connected to the second current electrode of N-channel transistor 152, a control electrode for receiving control signal VD, and a second current electrode connected to the control electrode of N-channel transistor 156. N-channel transistor 168 has a first current electrode connected to the second current electrode of N-channel transistor 166, a control electrode for receiving control signal VX, and a second current electrode connected to the second current electrode of N-channel transistor 152. N-channel transistor 170 has a first current electrode connected to the control electrode of N-channel transistor 154, a control electrode for receiving control signal VB, and a second current electrode connected to the second current electrode of N-channel transistor 166. N-channel transistor 172 has a first current electrode connected to the second current electrode of N-channel transistor 162, a control electrode for receiving control signal VB, and a second current electrode connected to the control electrode of N-channel transistor 160.

Generally, negative source degeneration functions to enhance the output impedance and make the gain of the output of analog delay cell 80 more linear. The NSDG unit 100 can be configured as a differential source-degenerative impedance having one of three different values: +2/gm, −2/gm, and Hi R (current mirror output resistance). Three control voltages Vd, Vx, and Vb are used to select the amount of currents I1 and I2. When all three control voltages are low, only N-channel transistors 154 and 160 sink current. When only Vd is high N-channel transistors 156 and 158 are connected as diodes in parallel with N-channel transistors 154 and 160, respectively. When only Vx is high, N-channel transistors 156 and 158 are connected as a cross-coupled pair of transistors. When only control signal Vb is high, N-channel transistors 156 and 158 are connected as current mirrors. Transistors 156 and 160 function as constant current sources. By using NSDG unit 100, the effective transconductance of the transconductance-capacitance stage 82 can be greatly enhanced without consuming significantly more power.

Figure 9:
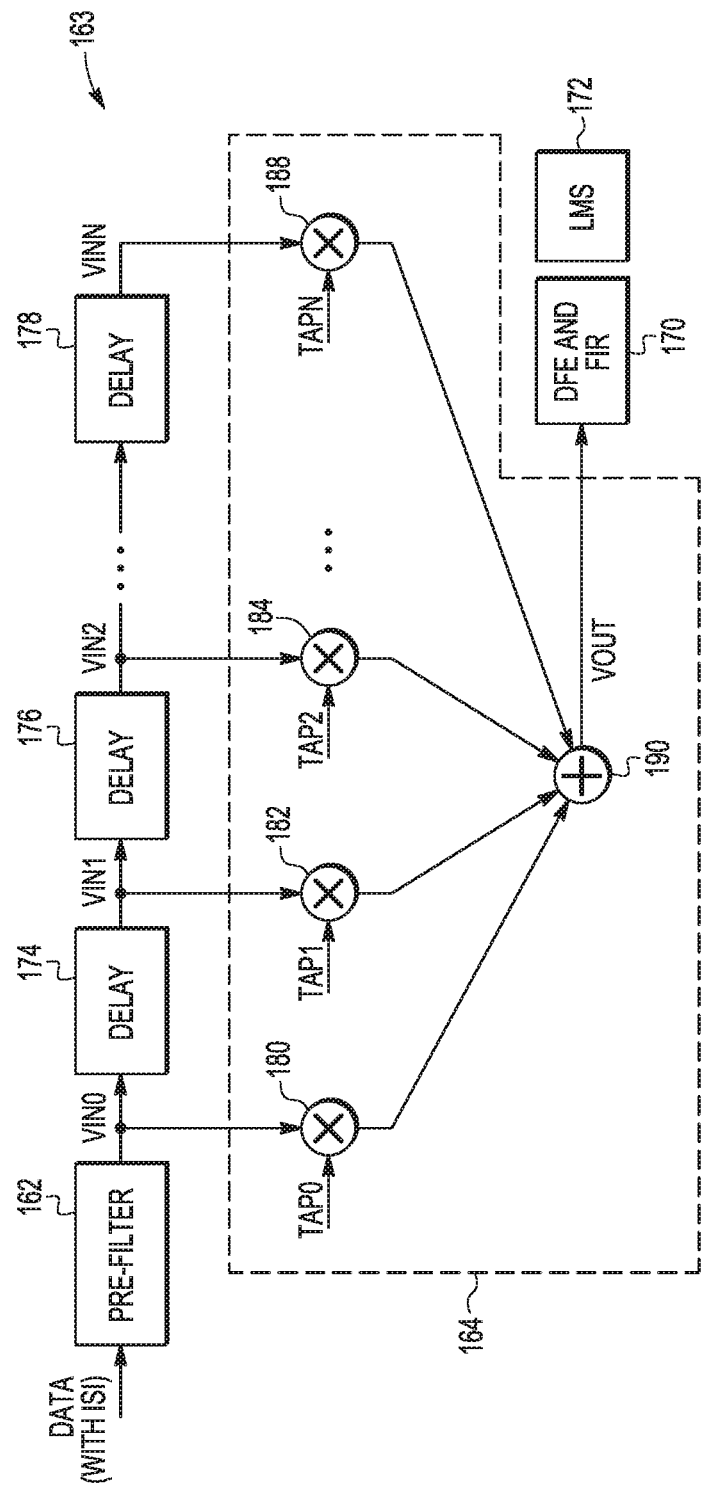
FIG. 9 illustrates a feed-forward equalizer in accordance with an embodiment.

FIG. 9 illustrates a feed-forward equalizer 160 in accordance with an embodiment. Feed-forward equalizer 160 includes pre-filter 162, a plurality of analog delay elements 163 represented by analog delay elements 174, 176, and 178 multiplier and summation circuit 164, decision feedback equalizer (DFE) and finite impulse response (FIR) block 170, and least means squared (LMS) block 172. The plurality of analog delay elements 163 may be characterized as being a tapped delay line. Multiplier and summation circuit 164 includes multiplier stages 180, 182, 184, and 188, and summation circuit 190. Pre-filter 162 has an input for receiving data signals labeled DATA (w/ISI), and an output. In one embodiment, pre-filter 162 is a continuous time linear equalizer (CTLE). A plurality of analog delay elements 163 includes analog delay elements 174, 176, and 178 connected together in series. Multiplier stage 180 has a first input connected to an output of pre-filter 162 labeled VIN0, a second input for receiving a tap signal labeled TAP0, and an output connected to an input of summation circuit 190. Multiplier stage 182 has a first input connected to an output of analog delay element 174 labeled VIN1, a second input for receiving a tap signal labeled TAP1, and an output connected to an input of summation circuit 190. Multiplier stage 184 has a first input connected to an output of analog delay element 176 labeled VIN2, a second input for receiving a tap signal labeled TAP2, and an output connected to an input of summation circuit 190. Multiplier stage 188 has a first input connected to an output of an analog delay element 178 labeled VINN, a second input for receiving a tap signal labeled TAPN, and an output connected to an input of summation circuit 190, where N is an integer greater than 1.

Summation circuit 190 has an input connected to the outputs of multiplier stages 180, 182, 184, and 188, and an output for providing an output signal labeled VOUT. Output signal VOUT may be further processed. For example, an output signal VOUT may be provided to DFE and FIR block 170 and LMS block 172.

In operation, input signal DATA is provided to the input of pre-filter 162. Pre-filter 162 provides a differential signal VIN0 to the input of multiplier stage 174 and to delay element 174. Multiplier stages 180, 182, 184, and 188 generate an AC current through the multiplication of the differential input signal VIN0 and subsequent input signals in combination with the effective gm value. For example, with respect to multiplier 180, the effective gm value is determined by the value of tap signal TAP0. Tap signals TAP0-TAPN are multi-bit signals. The outputs of multiplier stages 180, 182, 184, and 188 are summed together by summation circuit 190, and in response, summation circuit 190 provides an output voltage signal VOUT. The multiplier and summation circuit 164 is illustrated in more detail in FIG. 10.

Figure 10:
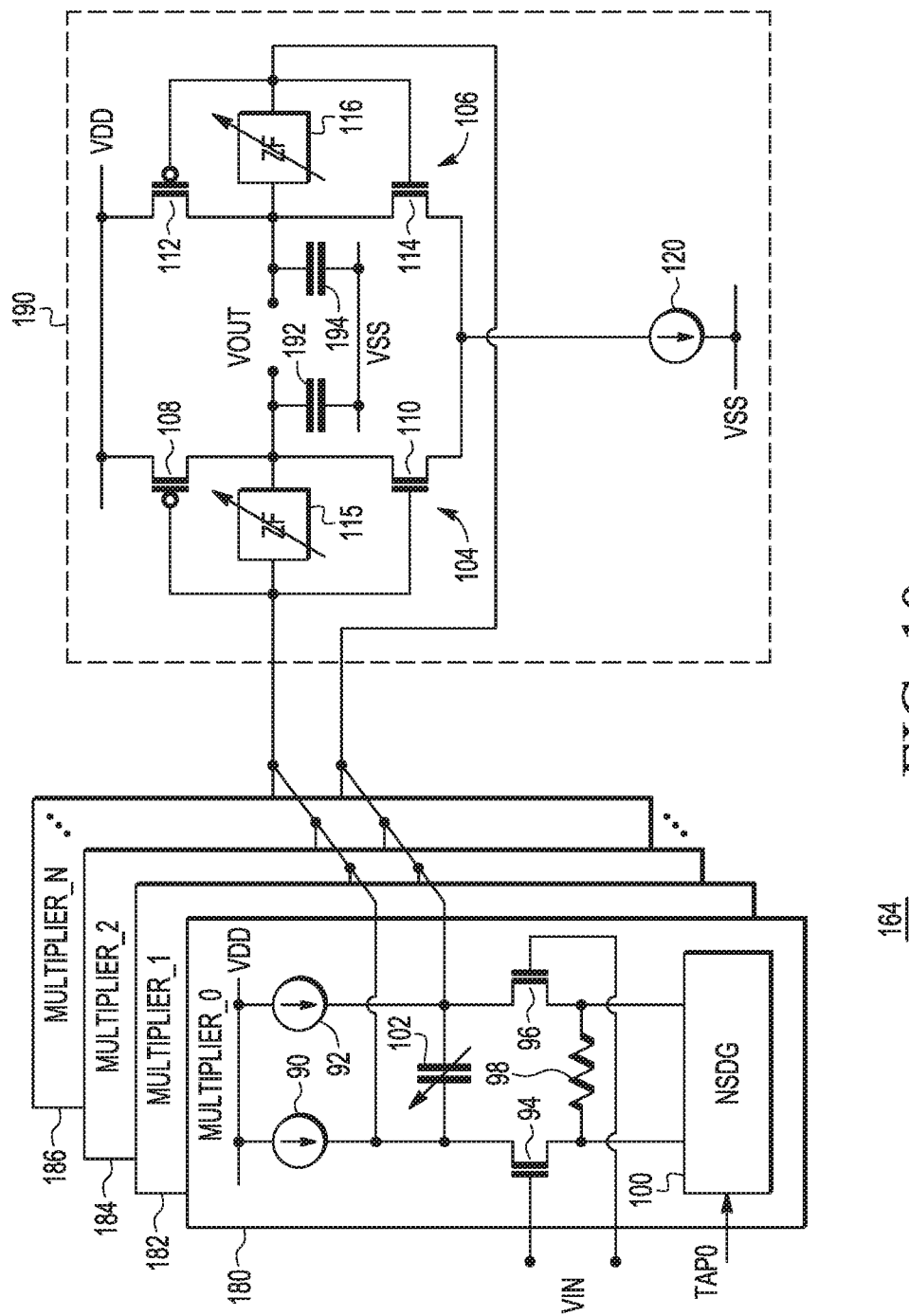
FIG. 10 illustrates the analog delay cell used as an analog multiplier and analog summation circuit in the feed-forward equalizer of FIG. 9.

FIG. 10 illustrates multiplier and summation circuit 164 in the feed-forward equalizer 160 of FIG. 9 in more detail. In multiplier and summation circuit 164, multiplier stages 180, 182, 184, and 188 are each substantially the same as transconductance-capacitance (gm-C) stage 82 illustrated in FIG. 5. The differential outputs of each of the multiplier stages is connected to the differential inputs of inductive-capacitive transimpedance amplifier (LC-TIA) stage 190. Inductive-capacitive transimpedance amplifier stage 190 is substantially the same as LC-TIA stage 84 in FIG. 5.

LC-TIA stage 190 functions as a summation circuit and combines all of the AC current components from multiplier stages 180, 182, 184, and 188 and converts then into a voltage output VOUT. Variable feedback impedances 115 and 116 are the same as in FIG. 6, but can be different in other embodiments (series or parallel configurations) depending on the gain and bandwidth requirements. For a maximum flat response with zero dB gain, the illustrated parallel network may be adequate. For a maximum bandwidth and gain performance, a series resistance-inductance connection may be preferred. Other combinations are possible. The tap signals TAP0-TAPN can be set to predetermined values or generated by a state-machine using a LMS algorithm as illustrated in FIG. 9 as LMS block 172.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An analog delay cell comprising:
   a transconductance stage comprising:
      a first current source having a first terminal coupled to receive a first power supply voltage, and a second terminal;
      a first transistor having a first current electrode coupled to the second terminal of the first current source, a control electrode for receiving a first input signal, and a second current electrode;
      a second current source having a first terminal coupled to receive the first power supply voltage, and a second terminal;
      a second transistor having a first current electrode coupled to the second terminal of the second current source, a control electrode for receiving a second input signal, and a second current electrode coupled to the second current electrode of the first transistor;
      a variable capacitor having a first terminal coupled to the first current electrode of the first transistor, a second terminal coupled to the first current electrode of the second transistor, and a control terminal for receiving a control signal; and
      a first current sink having a first terminal coupled to the second current electrodes of the first and second transistors, and a second terminal coupled to receive a second power supply voltage, wherein the first current sink provides negative-source degeneration; and
   a transimpedance stage comprising:
      a first inverter having an input terminal coupled to the first current electrode of the first transistor, an output terminal for providing a first output signal, a first power supply terminal and a second power supply terminal;
      a second inverter having an input terminal coupled to the first current electrode of the second transistor, and an output terminal for providing a second output signal, a first power supply terminal and a second power supply terminal;
      a first inductor having a first terminal coupled to the input terminal of the first inverter, and a second terminal coupled to the output terminal of the first inverter;
      a second inductor having first terminal coupled to the input terminal of the second inverter, and a second terminal coupled to the output terminal of the second inverter; and
      a second current sink having a first terminal coupled to the second power supply terminals of the first and second inverters, and second terminal coupled to receive the second power supply voltage.

2. The analog delay cell of claim 1, wherein the analog delay cell is one of a plurality of analog delay cells coupled together in series to form a finite impulse response tapped delay line.

3. The analog delay cell of claim 1, wherein the analog delay cell provides an all-pass delay function.

4. The analog delay cell of claim 1, further comprising:
a first variable resistor and a first capacitor coupled together in series with each other and coupled in parallel with the first inductor;
a first resistor coupled in parallel with the first inductor;
a second variable resistor and a second capacitor coupled together in series with each other and in parallel with the second inductor; and
a second resistor coupled in parallel with the second inductor.

5. The analog delay cell of claim 1, wherein the first current sink further comprises a negative-source degeneration unit, wherein the negative-source degeneration unit is configurable to provide at least one of:
a diode connection between the second current electrodes of the first and second transistors and the second power supply in response to a first control signal;
a cross-coupled pair of transistors coupled between the second current electrodes of the first and second transistors and the second power supply in response to a second control signal; and
a current mirror connection coupled between the second current electrodes of the first and second transistors and the second power supply in response to a third control signal.

6. The analog delay cell of claim 5, wherein the analog delay cell is used in a tapped delay line comprising a plurality of delay cells coupled together in series, a plurality of multipliers, each multiplier of the plurality of multipliers coupled to an output of a corresponding delay cell of the plurality of delay cells, an output of each of the multipliers coupled to an input of a summation circuit, wherein each multiplier comprises a transconductance stage substantially the same as the transconductance stage of the analog delay cell, and wherein the summation circuit comprises a transimpedance stage substantially the same as the transimpedance stage of the analog delay cell.

7. The analog delay cell of claim 5, further comprising a resistor having a first terminal coupled to the second current electrode of the first transistor of the transconductance stage, and a second terminal coupled to the second current electrode of the second transistor of the transconductance stage.

8. The analog delay cell of claim 1, wherein the first and second input signals are characterized as being a differential input signal and the first and second output signals are characterized as being a differential output signal.

9. The analog delay cell of claim 1, wherein the analog delay cell is used in a feed-forward equalization circuit comprising:
a pre-filter coupled to receive an input signal, and an output;
a plurality of analog delay cells coupled together in series to receive the input signal, and having a plurality of taps;
a plurality of analog multiplier circuits, each of the plurality of analog multiplier circuits having an input coupled to a corresponding tap of the plurality of taps, and an output; and an analog summation circuit coupled to the outputs of the plurality of analog multiplier circuits, and an output for providing an output signal.

10. A circuit comprising:
a plurality of transconductance stages arranged to provide an analog delay and an analog multiplier function, each of the transconductance stages comprising:
a first current source having a first terminal coupled to receive a first power supply voltage, and a second terminal;
a first transistor having a first current electrode coupled to the second terminal of the first current source, a control electrode for receiving a first input signal, and a second current electrode;
a second current source having a first terminal coupled to receive the first power supply voltage, and a second terminal;
a second transistor having a first current electrode coupled to the second terminal of the second current source, a control electrode for receiving a second input signal, and a second current electrode coupled to the second current electrode of the first transistor;
a variable capacitor having a first terminal coupled to the first current electrode of the first transistor, a second terminal coupled to the first current electrode of the second transistor, and a control terminal for receiving a control signal; and
a negative-source degeneration unit having a first terminal coupled to the second current electrode of the first transistor, a second terminal coupled to the second current electrode of the second transistor, a control terminal for receiving a control signal for setting a delay, and a second terminal coupled to receive a second power supply voltage; and
a transimpedance stage coupled to the plurality of transconductance stages, the transimpedance stage comprising:
a first inverter having an input terminal coupled to the first current electrode of the first transistor, an output terminal for providing a first output signal, a first power supply terminal and a second power supply terminal;
a second inverter having an input terminal coupled to the first current electrode of the second transistor, and an output terminal for providing a second output signal, a first power supply terminal and a second power supply terminal;
a first inductor having a first terminal coupled to the input terminal of the first inverter, and a second terminal coupled to the output terminal of the first inverter;
a second inductor having first terminal coupled to the input terminal of the second inverter, and a second terminal coupled to the output terminal of the second inverter; and
a current sink having a first terminal coupled to the second power supply terminals of the first and second inverters, and second terminal coupled to receive the second power supply voltage.

11. The circuit of claim 10, further comprising:
a first variable resistor and a first capacitor coupled together in series with each other and coupled in parallel with the first inductor;
a first resistor coupled in parallel with the first inductor;
a second variable resistor and a second capacitor coupled together in series with each other and in parallel with the second inductor; and a second resistor coupled in parallel with the second inductor.

12. The circuit of claim 10, wherein the analog delay cell provides an all-pass delay function.

13. The circuit of claim 10, wherein the negative-source degeneration unit is configurable to provide at least one of:
a diode connection between the second current electrodes of the first and second transistors and the second power supply in response to a first control signal;
a cross-coupled pair of transistors coupled between the second current electrodes of the first and second transistors and the second power supply; and
a current mirror connection coupled between the second current electrodes of the first and second transistors and the second power supply.

14. The circuit of claim 13, further comprising a resistor having a first terminal coupled to the second current electrode of the first transistor of the transconductance stage, and a second terminal coupled to the second current electrode of the second transistor of the transconductance stage.

15. The analog delay cell of claim 10, wherein the first and second input signals are characterized as being a differential input signal and the first and second output signals are characterized as being a differential output signal.

16. The circuit of claim 10, further comprising a pre-filter having an input coupled to receive an input signal, and an output coupled to the plurality of transconductance stages.

17. A circuit comprising:
a pre-filter having an input coupled to receive an input signal, and an output;
a plurality of transconductance stages arranged to provide an analog delay and an analog multiplier function for the input signal, each of the transconductance stages comprising:
a first current source having a first terminal coupled to receive a first power supply voltage, and a second terminal;
a first transistor having a first current electrode coupled to the second terminal of the first current source, a control electrode for receiving a first input signal, and a second current electrode;
a second current source having a first terminal coupled to receive the first power supply voltage, and a second terminal;
a second transistor having a first current electrode coupled to the second terminal of the second current source, a control electrode for receiving a second input signal, and a second current electrode coupled to the second current electrode of the first transistor;
a variable capacitor having a first terminal coupled to the first current electrode of the first transistor, a second terminal coupled to the first current electrode of the second transistor, and a control terminal for receiving a control signal; and
a negative-source degeneration unit having a first terminal coupled to the second current electrode of the first transistor, a second terminal coupled to the second current electrode of the second transistor, a control terminal for receiving a control signal, and a second terminal coupled to receive a second power supply voltage, wherein the negative-source degeneration unit is configurable to provide at least one of:
a diode connection between the second current electrodes of the first and second transistors and the second power supply in response to a first control signal; a cross-coupled pair of transistors coupled between the second current electrodes of the first and second transistors and the second power supply; and a current mirror connection coupled between the second current electrodes of the first and second transistors and the second power supply; and
a transimpedance stage coupled to the plurality of transconductance stages, the transimpedance stage comprising:
a first inverter having an input terminal coupled to the first current electrode of the first transistor, an output terminal for providing a first output signal, a first power supply terminal and a second power supply terminal;
a second inverter having an input terminal coupled to the first current electrode of the second transistor, and an output terminal for providing a second output signal, a first power supply terminal and a second power supply terminal;
a first inductor having a first terminal coupled to the input terminal of the first inverter, and a second terminal coupled to the output terminal of the first inverter;
a second inductor having first terminal coupled to the input terminal of the second inverter, and a second terminal coupled to the output terminal of the second inverter; and
a current sink having a first terminal coupled to the second power supply terminals of the first and second inverters, and second terminal coupled to receive the second power supply voltage.

18. The circuit of claim 17, further comprising a resistor having a first terminal coupled to the second current electrode of the first transistor of the transconductance stage, and a second terminal coupled to the second current electrode of the second transistor of the transconductance stage.

19. The circuit of claim 17, wherein the first and second input signals are characterized as being a differential input signal and the first and second output signals are characterized as being a differential output signal.

20. The circuit of claim 17, further comprising:
a first variable resistor and a first capacitor coupled together in series with each other and coupled in parallel with the first inductor;
a first resistor coupled in parallel with the first inductor;
a second variable resistor and a second capacitor coupled together in series with each other and in parallel with the second inductor; and
a second resistor coupled in parallel with the second inductor.

* * * * *